US012621991B2

(12) United States Patent     (10) Patent No.:    US 12,621,991 B2

Lan       (45) Date of Patent:      May 5, 2026

(54) SEMICONDUCTOR STRUCTURE AND METHOD OF FORMING THE SAME

(71) Applicant: Winbond Electronics Corp., Taichung City (TW)

(72) Inventor: Shun-Li Lan, Taichung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 368 days.

(21) Appl. No.: 18/331,801

(22) Filed: Jun. 8, 2023

(65) Prior Publication Data

US 2024/0341093 A1     Oct. 10, 2024

(30) Foreign Application Priority Data

Apr. 6, 2023    (TW) .................................. 112112838

(51) Int. Cl.
| | |
|---|---|
| *H10B 41/42* | (2023.01) |
| *H10B 41/30* | (2023.01) |
| *H10B 41/50* | (2023.01) |

(52) U.S. Cl.
CPC .............. *H10B 41/42* (2023.02); *H10B 41/30* (2023.02); *H10B 41/50* (2023.02)

(58) Field of Classification Search
CPC ........ H10B 41/42; H10B 41/30; H10B 41/50; H10B 41/40
See application file for complete search history.

(56) References Cited

U.S. PATENT DOCUMENTS

| | | | |
|---|---|---|---|
| 7,183,174 B2 | 2/2007 | Park | |
| 11,171,148 B2 | 11/2021 | Smith | |
| 2009/0325360 A1 | 12/2009 | Lim | |
| 2021/0035997 A1* | 2/2021 | Smith | ............... H01L 21/76232 |
| 2024/0194755 A1* | 6/2024 | Huang | ................. H10D 64/017 |

* cited by examiner

*Primary Examiner* — Jonathan Han

(74) *Attorney, Agent, or Firm* — Birch, Stewart, Kolasch & Birch, LLP

(57)        ABSTRACT

A method of forming a semiconductor structure includes providing a substrate with an array region, a peripheral region, and a transition region between the array region and the peripheral region. A patterned floating gate layer is formed on the array region and the peripheral region, and a stacked layer is conformally formed on the substrate, wherein a recess is formed over the transition region. A photoresist layer is formed on the substrate, and the photoresist layer is patterned to form an array region pattern on the stacked layer of the array region, wherein a portion of the photoresist layer remains at the bottom of the recess, and a recess pattern is formed. The array region pattern and the recess pattern are sequentially transferred to the stacked layer, the patterned floating gate layer and the substrate to form a plurality of arrays and a pair of blocking structures.

19 Claims, 8 Drawing Sheets

SEMICONDUCTOR STRUCTURE AND METHOD OF FORMING THE SAME

CROSS REFERENCE TO RELATED APPLICATIONS

This Application claims priority of Taiwan Patent Application No. 112112838 filed on Apr. 6, 2023, the entirety of which is incorporated by reference herein.

BACKGROUND OF THE INVENTION

Field of the Invention

The present disclosure relates to a semiconductor process, and in particular to a method of forming a blocking structure.

Description of the Related Art

The critical dimensions of memory elements are gradually being scaled down as development of those memory elements advances, and the challenge of lithography processing is gradually increasing. In a conventional lithography process, the reduction of critical dimensions includes the use of optical elements with larger numerical apertures, shorter exposure wavelengths, and the use of interface materials other than air (e.g., water immersion). As the resolution of lithography processes approaches its theoretical limit, vendors have taken approaches such as double-patterning to overcome the optical limit and increase the integration of memory elements.

However, during the process of forming a memory device, a doping path may be formed in the transition region between the array region and the peripheral region, which may result in leakage current. Therefore, in order to lower the cost while maintaining the level of the product's performance, the industry still needs to improve the method of forming semiconductor structures to achieve the desired goal of maintaining the yield of the memory device.

BRIEF SUMMARY OF THE INVENTION

An embodiment of the present disclosure provides a method of forming a semiconductor structure. The method comprises: providing a substrate with an array region, a peripheral region, and a transition region between the array region and the peripheral region; forming a patterned floating gate layer on the array region and the peripheral region; conformally forming a stacked layer on the substrate, thereby forming a recess over the transition region; forming a photoresist layer on the substrate and filling it into the recess; patterning the photoresist layer to form an array region pattern on the stacked layer of the array region, wherein a portion of the photoresist layer remains at the bottom of the recess, thereby forming a recess pattern; and sequentially transferring the array region pattern and the recess pattern to the stacked layer, the patterned floating gate layer, and the substrate to form a plurality of arrays in the array region and a pair of blocking structures in the transition region.

Another embodiment of the present disclosure provides a semiconductor structure, comprising a plurality of arrays, a peripheral structure, and a pair of blocking structures. The arrays are disposed in an array region of a substrate. The peripheral structure is disposed in a peripheral region of the substrate. The blocking structures are disposed in a transition region of the substrate and comprise a portion of the substrate. The transition region is disposed between the array region and the peripheral region.

DETAILED DESCRIPTION OF THE INVENTION

During the process of forming a conventional memory device, after the arrays and peripheral structure are formed, the damaged semiconductor structure is repaired by filling the corresponding trenches with dielectric material and performing an annealing process before proceeding to the subsequent process. However, during the annealing process, the dielectric material may be heated and expanded, thereby causing a pushing stress at the interface between the dielectric material and the substrate in the relative open region (e.g., in the transition region between the array region and the peripheral region). Further, the dopant (e.g., boron) in the array region diffuse along the interface between the dielectric material and the substrate into the peripheral structures in the peripheral region, thereby causing leakage current and reducing the electrical performance of the device. In other cases, the dopant in the peripheral region is subjected to an extrusion stress and diffuses into the arrays in the array region, which also causing leakage current and reducing the electrical performance of the device. By forming a blocking structure in the transition region, the embodiment of the present disclosure increases the contact area of the interface between the dielectric material and the substrate in the transition region, making it more difficult for the dopant to diffuse into the peripheral region to reduce the occurrence of leakage current. That is, the embodiment of the present disclosure increases the length of the path that may result in dopant diffusion to reduce the occurrence of leakage current. In addition, forming the ground contact to connect the blocking structures helps to improve the impact of the etching loading effect on the source/drain contact connected to the peripheral structure and to maintain the performance of the device.

Figures 1, 2:
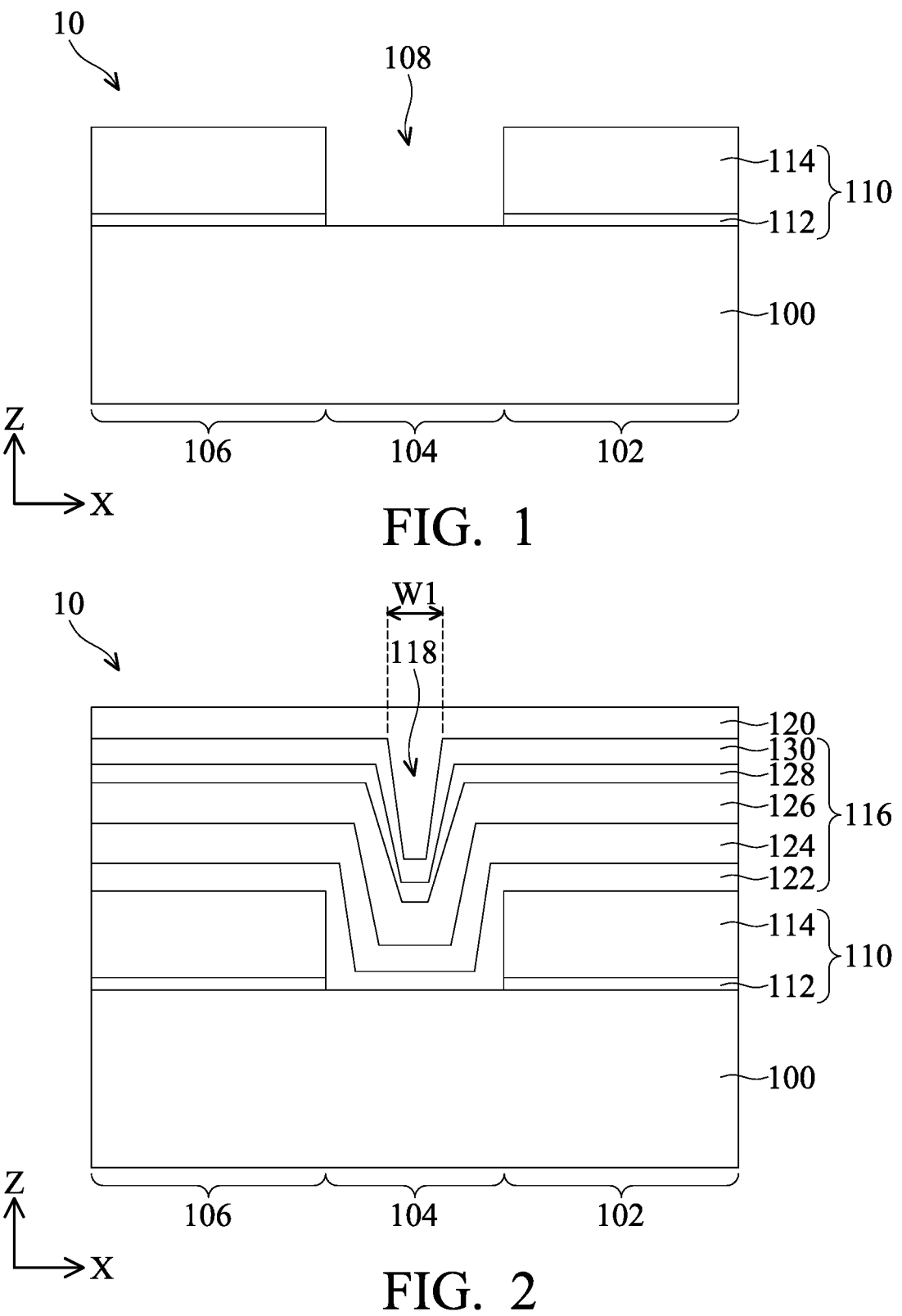
FIGS. 1 to 11 illustrate cross-sectional views of intermediate stages of forming the semiconductor structure according to some embodiments of the present disclosure.

FIG. 1 illustrates a cross-sectional view of the semiconductor structure 10, such as the cross-sectional view of a plane along the direction X and the direction Z. First, a substrate 100 is provided with an array region 102, a transition region 104, and a peripheral region 106. The transition region 104 is located between the array region 102 and the peripheral region 106. The substrate 100 may be an elemental semiconductor substrate, a compound semiconductor substrate, an alloy semiconductor substrate, or an insulator-on-semiconductor substrate.

Next, a patterned floating gate layer 110 is formed on the array region 102 and the peripheral region 106 of the substrate 100. A tunneling dielectric layer 112 and the conductive layer 114 may be sequentially formed on the substrate 100, and a patterning process may be performed to form the patterned floating gate layer 110. In some embodiments, forming the conductive layer 114 by performing an in-situ doping process. For example, an N-type polysilicon layer may be formed first and specific regions may be doped into a P-type polysilicon layer by in-situ doping. In some embodiments, the conductive layer 114 on the array region 102 is P-type, while the conductive layer 114 on the peripheral region 106 is N-type. In other embodiments, different conductive types of conductive layers 114 may be formed in different regions, for example, an N-type conductive layer 114 may be formed in the peripheral region 106 followed by a P-type conductive layer 114 in the array region 102, or a P-type conductive layer 114 may be formed in the array region 102 followed by an N-type conductive layer 114 in the peripheral region 106. The material of the tunneling dielectric layer 112 may include an oxide, such as silicon oxide. The material of the conductive layer 114 may include doped polycrystalline silicon.

The patterned floating gate layer 110 has an opening 108 between the array region 102 and the peripheral region 106 of the substrate 100. In one embodiment, by changing the aspect ratio of the opening 108 of the patterned floating gate layer 110 over the transition region 104, the subsequently formed stacked layer 116 may not completely fill the opening 108, and a recess 118 is correspondingly formed over the opening 108. Further, the subsequent lithography process may leave the photoresist at the bottom of the recess 118, and the remaining photoresist pattern 134 may further correspondingly form a pair of blocking structures 160 in the subsequent process, as will be described in detail later. In some embodiments, the aspect ratio of the opening 108 is greater than about 0.13. If the aspect ratio of the opening 108 less than 0.13, the stacked layer 116 may completely fill the opening 108, and thus may not correspondingly form the blocking structures 160 in a subsequent process.

Referring to FIG. 2, a stacked layer 116 is conformally formed on the substrate 100, thereby forming a recess 118 over the transition region 104, and a photoresist layer 120 is formed on the substrate 100 and filled into the recess 118. In some embodiments, forming the stacked layer 116 includes sequentially forming the protective layer 122, the conductor layer 124, the mandrel layer 126, the stop layer 128, and the anti-reflection layer 130 on the substrate 100. In some embodiments, the protective layer 122 prevents the patterned floating gate layer 110 from being affected by additional etching process. In some embodiments, the conductor layer 124 may be used as a mask to transfer the pattern of the sidewall spacer to the patterned floating gate layer 110 and the substrate 100, and the mandrel layer 126 may be used to perform multiple patterning processes to form the sidewall spacer, as will be described in detail later. In some embodiments, the stop layer 128 may be used as a stop layer for patterning the photoresist layer 120, while the anti-reflection layer 130 may improve the pattern quality of the photoresist layer 120, such as reducing light reflection and the formation of standing waves. In some embodiments, the protective layer 122 may include an oxide formed from tetraethylorthosilicate (TEOS), silicon nitride, or a combination thereof. The material of the conductor layer 124 may include undoped polycrystalline silicon. The material of mandrel layer 126 may include carbon. The anti-reflection layer 130 may include a bottom anti-reflection coating (BARC). In some embodiments, the recess 118 has an opening width W1 that is about 30 nm to 40 nm. In some embodiments, the depth of the recess 118 is from about 50 nm to 150 nm, so that the bottom of the recess 118 has a different optical effect than the top surface of the anti-reflection layer 130.

Figure 3:
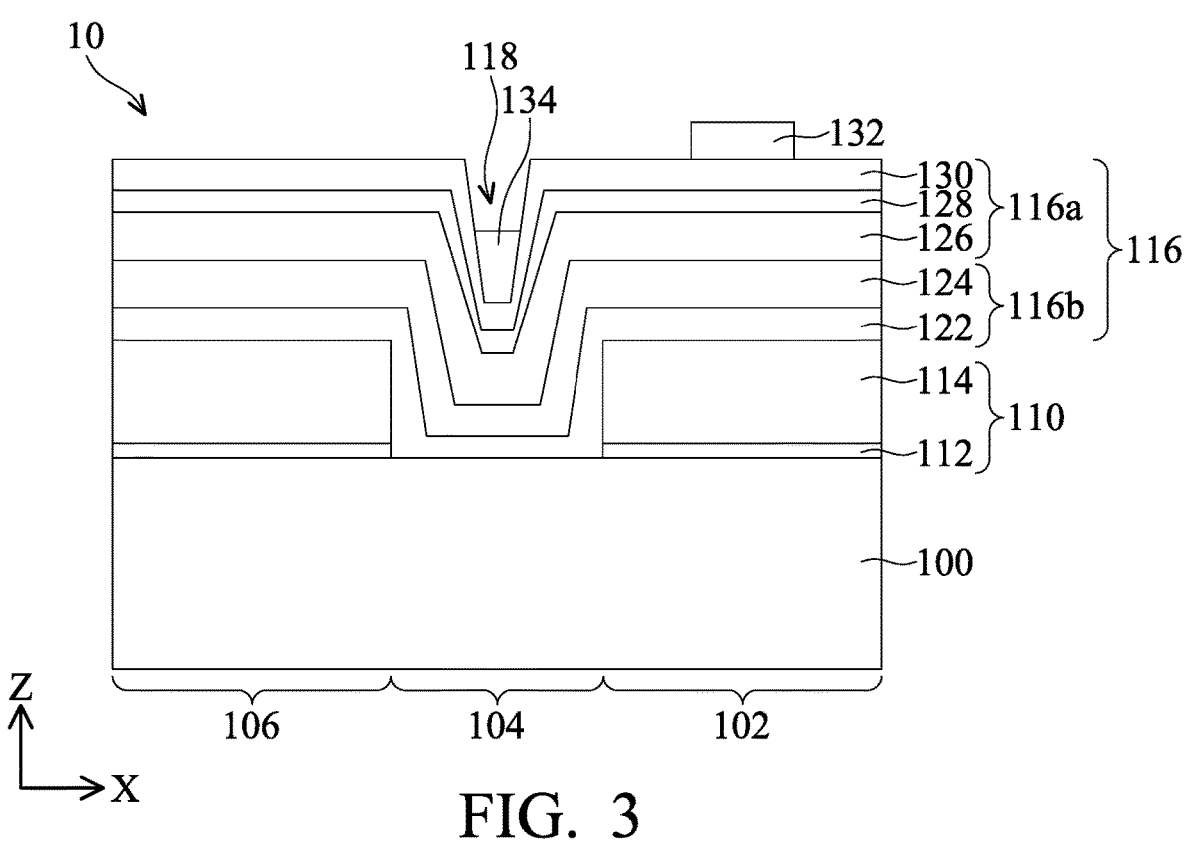

Referring to FIG. 3, patterning the photoresist layer 120 to form the array region pattern 132 on the stacked layer 116 of the array region 102. A portion of the photoresist layer 120 remains at the bottom of the recess 118, thereby forming the recess pattern 134. In one embodiment, the recess 118 is formed by increasing the aspect ratio of the opening 108, and while patterning the photoresist layer 120, the optical effect on the portion of the photoresist layer 120 at the bottom of the recess 118 may be different from that on the rest of the photoresist layer 120. In other words, because the recess 118 has a certain depth, the portion of the photoresist layer 120 at the bottom of the recess 118 may not be fully exposed. As a result, during the subsequent process of removing the photoresist layer 120, the portion of the photoresist layer 120 at the bottom of the recess 118 and the portion of the photoresist layer 120 that is covered by the patterned mask and not being exposed are left, thereby forming a recess pattern 134 over the transition region 104 and forming the array region pattern 132 over the array region 102, respectively. In some embodiments, the anti-reflection layer 130 is in direct contact with the recess pattern 134.

Figure 4:
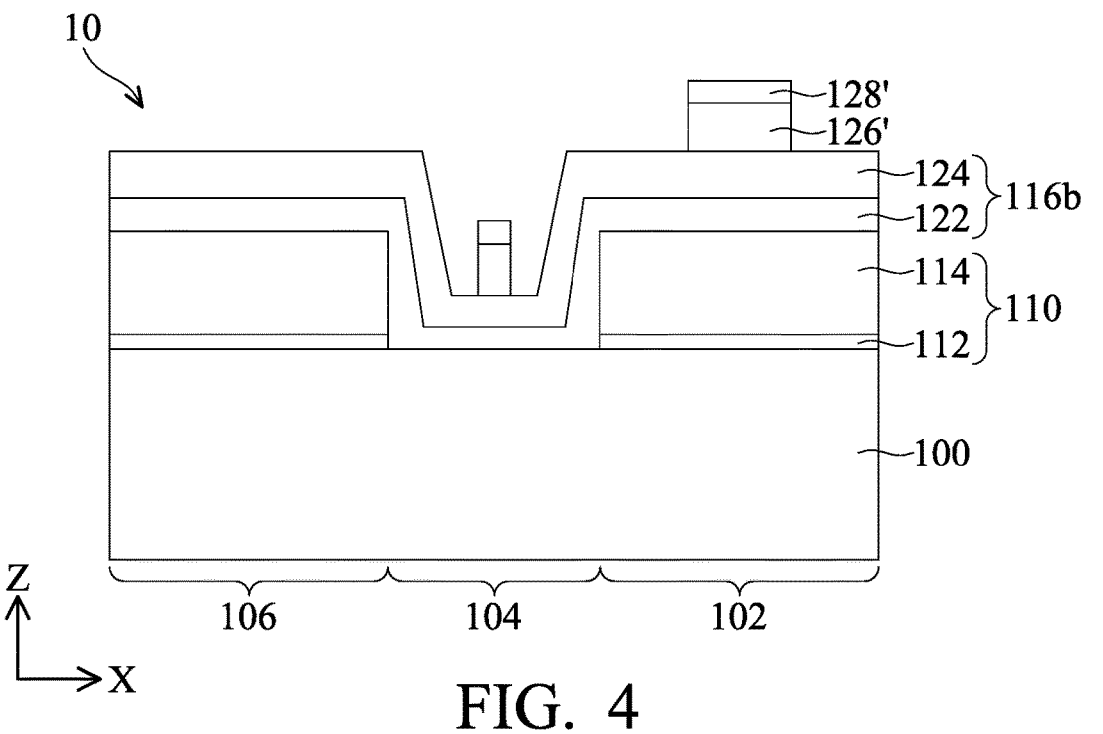

FIGS. 4 to 9 illustrates a cross-sectional view of sequentially transferring the array region pattern 132 and the recess pattern 134 to the stacked layer 116, the patterned floating gate layer 110, and the substrate 100. Referring to FIG. 4, using the array region pattern 132 and the recess pattern 134 as a mask, the first portion 116a of the stacked layer 116 is etched to form the patterned mandrel layer 126' and the patterned stop layer 128'. The first portion 116a includes the mandrel layer 126, the stop layer 128, and the anti-reflection layer 130. In some embodiments, after forming the patterned mandrel layer 126' and the patterned stop layer 128', a trimming process (not shown) may be performed to further reduce the widths of the patterned mandrel layer 126' and the patterned stop layer 128' to reduce the line width of the subsequently formed device. After forming the patterned mandrel layer 126' and the patterned stop layer 128', the remaining anti-reflection layer 130, the array region pattern 132, and the recess pattern 134 may be removed while leaving the patterned mandrel layer 126' and the patterned stop layer 128' to continue the subsequent multiple patterning process.

Figure 5:
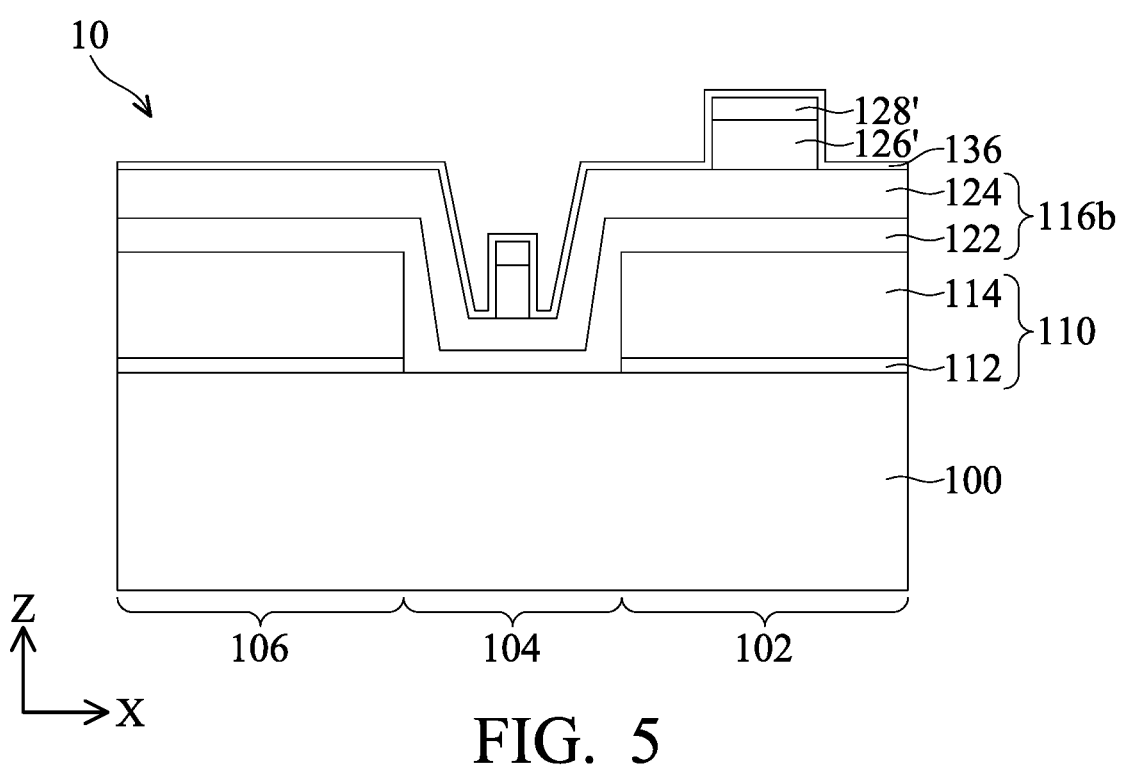
Figure 6:
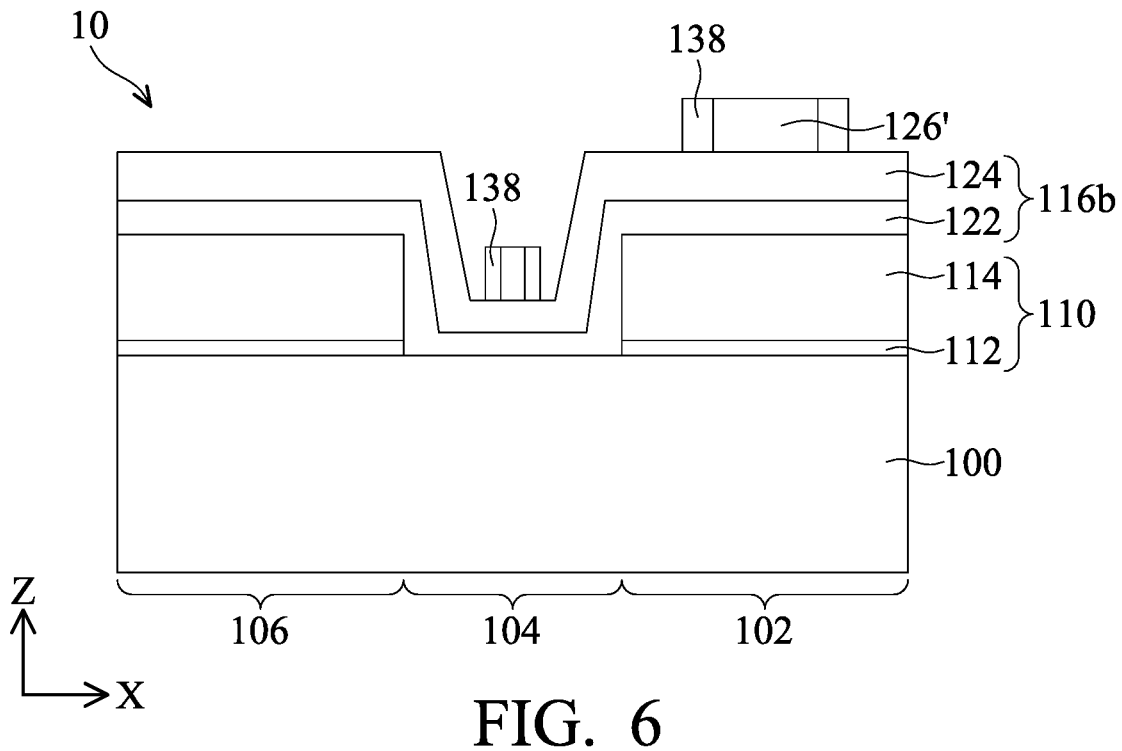
Figures 7, 8:
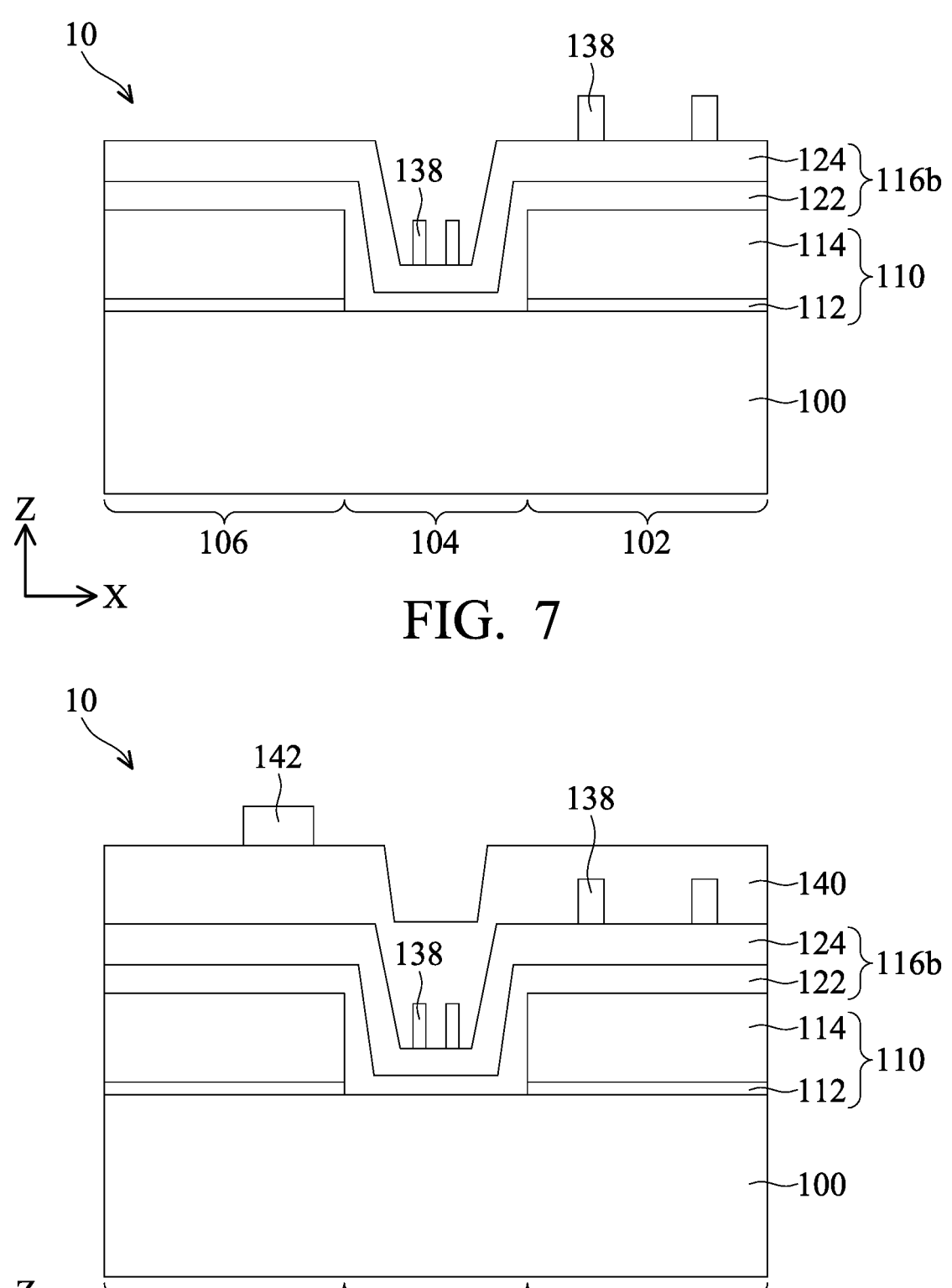

FIGS. 5 to 7 illustrate the steps of performing a self-aligned multiple patterning process on the semiconductor structure 10, such as a self-aligned double patterning (SADP) process or a self-aligned quadruple patterning (SAQP) process. Referring to FIG. 5, the spacer material layer 136 is conformally formed on the substrate 100. Specifically, the spacer material layer 136 is formed on the top surface of the second portion 116b of the stacked layer 116, on the sidewalls of the patterned mandrel layer 126', and on the sidewalls and the top surface of the patterned stop layer 128'. The second portion 116b may include a protective layer 122 and a conductor layer 124. In some embodiments, the spacer material layer 136 may be formed by a process such as a chemical vapor deposition process, an atomic layer deposition process, or a combination thereof.

Referring to FIG. 6, an etching back process is performed on the spacer material layer 136 until the top surfaces of the patterned mandrel layer 126' and the second portion 116b are exposed, thereby forming a plurality of sidewall spacers 138 on the sidewalls of the patterned mandrel layer 126'. Referring to FIG. 7, the patterned mandrel layer 126' is removed, thereby leaving the sidewall spacers 138 on the top surface of the second portion 116b. In some embodiments, the etching back process may include anisotropic etching processes (or directional etching processes), such as reactive ion etching (RIE) processes, plasma etching, inductively coupled plasma (ICP) etching, or a combination thereof for dry etching.

Figures 9, 10:
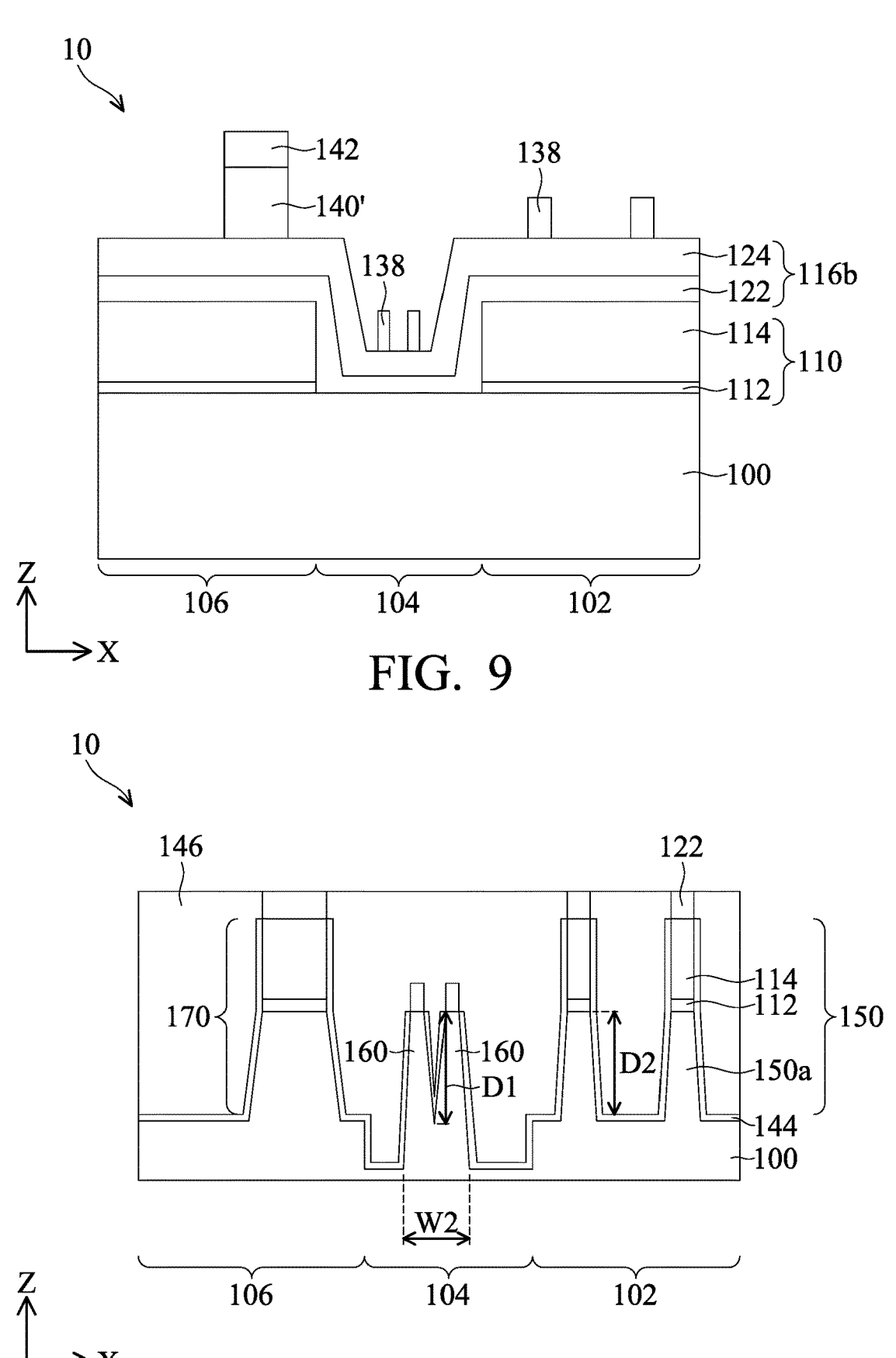

After forming the sidewall spacers 138, the pattern of the peripheral region 106 may be defined subsequently. Referring to FIG. 8, a mask layer 140 is formed on the substrate 100 and covers the sidewall spacers 138. A peripheral region pattern 142 is formed on the mask layer 140 in the peripheral region 106. The mask layer 140 protects the sidewall spacers 138 from being damaged when forming the peripheral region pattern 142. The formation of the peripheral region pattern 142 may be similar to the formation of the array region pattern 132, including forming a photoresist layer, patterning with a mask, and removing the undesired photoresist layer (not shown separately) to obtain the peripheral region pattern 142. Referring to FIG. 9, transferring the peripheral region pattern 142 to the mask layer 140 and exposing the sidewall spacers 138 to form the patterned mask layer 140'. The peripheral region pattern 142 and the patterned mask layer 140' are used to correspondingly form the peripheral structure 170 in the peripheral region 106 in a subsequent process, as will be described in detail later. In some embodiments, the mask layer 140 may include a spin on silicon anti-reflection coating (SOSA).

Referring to FIG. 10, the peripheral region pattern 142 may be removed, and the sidewall spacers 138 and patterned mask layer 140' may be used as a mask to sequentially etch the second portion 116b of the stacked layer 116, the patterned floating gate layer 110, and the substrate 100 to form a plurality of arrays 150 in the array region 102, a pair of blocking structures 160 in the transition region 104, and a peripheral structure 170 in the peripheral region 106. In some embodiments, the sidewall spacers 138 on the array region 102 correspondingly form the arrays 150, the sidewall spacers 138 on the transition region 104 correspondingly form the blocking structures 160, and the patterned mask layer 140' on the peripheral region 106 correspondingly forms a peripheral structure 170. The blocking structures 160 is formed by a portion of the substrate 100. It should be noted that the sidewall spacers 138 of the transition region 104 are formed by multiple patterning, so that the sidewall spacers 138 may appear in pairs and correspondingly form paired blocking structures 160. After the etching process, the conductor layer 124 is removed during the process, leaving the protective layer 122 on the top surfaces of the arrays 150, the pair of blocking structures 160, and the peripheral structure 170.

Next, a liner 144 is conformally formed to cover the sidewalls of the arrays 150, the pair of blocking structures 160, and the peripheral structure 170. A dielectric layer 146 is formed to fill the trenches between the arrays 150, the blocking structures 160, and the peripheral structure 170. An annealing process is performed on the semiconductor structure 10. In conventional processes, during the annealing process, the dielectric layer 146 may expand thermally and adversely generate a pushing stress at the interface between the dielectric layer 146 and the substrate 100, such that the dopant in the arrays 150 may diffuse along the interface to the peripheral structure 170, or the dopant in the peripheral structure 170 may diffuse along the interface to the arrays 150. However, in the embodiment of the present disclosure, by providing the pair of blocking structures 160, the contact area between the dielectric layer 146 and the substrate 100 may be increased. That is, the possible diffusion path of the dopant may be increased (the interface between the dielectric layer 146 and the substrate 100 may be increased), thereby avoiding or reducing the possibility of the dopant diffusing to the peripheral structure 170, and reducing the possibility of leakage current from the subsequently formed memory device. In some embodiments, the arrays 150 include bottoms 150a formed by the substrate 100, a tunneling dielectric layer 112 on the bottoms 150a, and a conductive layer 114 on the tunneling dielectric layer 112. In some embodiments, the top surface of the blocking structures 160 is level with the top surface of the bottoms 150a. In some embodiments, the liner 144 is selectively deposited on the sidewall surfaces of the substrate 100, the tunneling dielectric layer 112, and the conductive layer 114. The liner 144 is selectively deposited by such as atomic layer deposition processes, chemical vapor deposition processes, and other similar processes that react with the sidewall surfaces of the substrate 100, the tunneling dielectric layer 112, and the conductive layer 114 but not with the protective layer 122. The liner 144 effectively reduces oxidation or related damage to the substrate 100, the tunneling dielectric layer 112, and the conductive layer 114 from subsequent processes.

In some embodiments, the top surface of the blocking structures 160 is lower than that of the arrays 150. In some embodiments, the depth D1 of the trenches between the blocking structures 160 is greater than the depth D2 of the trenches between the bottoms 150a of the arrays 150. In some embodiments, the depth D1 may range from about 200 nm to about 300 nm. In some embodiments, the depth D2 may range from about 100 nm to about 200 nm. In some embodiments, the bottom width W2 of the blocking structures 160 may range from about 450 nm to about 550 nm.

Figures 11, 12:
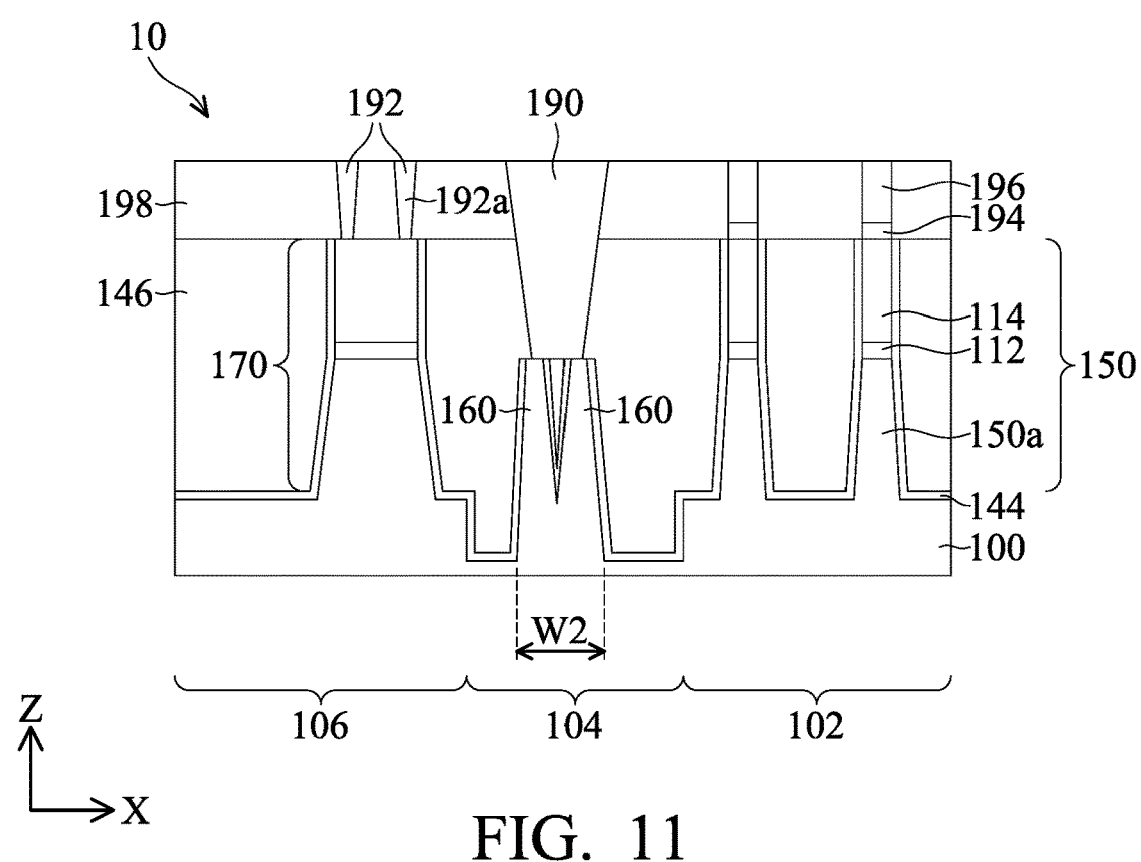
FIGS. 12 to 13 illustrate layout of the semiconductor structure according to some embodiments of the present disclosure.

The semiconductor structure 10 may proceed to further processes to form a complete memory device. FIG. 11 illustrates a cross-sectional view of the semiconductor structure 10 after forming the inter-gate dielectric layer 194 and the control gate layer 196. After the annealing process is performed, a planarization process to the semiconductor structure 10 may be performed until the stacked layer 116 of the array region 102 and the peripheral region 106 is removed and the top surface of the arrays 150 and peripheral structure 170 is exposed, while the protective layer 122 still covers the blocking structures 160 in the transition region 104. Next, the inter-gate dielectric layer 194 and the control gate layer 196 may be sequentially formed on the top surface of the arrays 150, thereby forming a complete cell in the array region 102. Similarly, the relevant conductor structures may be formed jointly on the top surface of the peripheral structure 170, and the relevant conductor structures are omitted for the sake of simplicity. In some embodiments, the inter-gate dielectric layer 194 may be a composite layer composed of, for example, oxide/nitride/oxide (ONO), but the present disclosure is not limited to it. In some embodiments, the control gate layer 196 may be a material similar to the conductive layer 114 or a similar conductor material.

Continuing referring to FIG. 11, after the complete cell is formed, the semiconductor structure 10 may proceed to further processes to form the memory device. For example, a ground contact 190 and a pair of source/drain contacts 192 may be formed to connect to the blocking structures 160 and the peripheral structure 170, respectively, and the etching process sequentially removes the dielectric layer 146 and the protective layer 122 during the formation of the ground contact 190. In some embodiments, the ground contact 190 penetrates through the dielectric layer 198 and the dielectric layer 146 until the ground contact 190 contacts the top surface of the blocking structures 160. In some embodiments, the source/drain contact 192 penetrates through the dielectric layer 198 and contacts the top surface of the peripheral structure 170. In conventional processes, since the pair of blocking structures 160 is not formed in the transition region 104 and the ground contact 190 is not formed to connect to the substrate 100, during the etching process of forming the source/drain contacts 192 connected to the peripheral structure 170, a portion 192a of the source/drain contacts 192 closer to the transition region 104 is susceptible to etching loading effect due to the spatial structure difference (located in a relatively open region). That is, the portion 192a is affected by a relatively large etching intensity, such that the portion 192a of the source/drain contacts 192 may extend further into the peripheral structure 170 and damage the original structure. However, in the embodiment of the present disclosure, by forming the ground contact 190, the etching loading effect on the portion 192a of the original source/drain contact 192 may be shared, so that the source/drain contacts 192 may have a consistent depth, and the ground contact 190 has relatively low requirements on the structure of the semiconductor structure 10, thus maintaining the electrical performance of the peripheral structure of the memory device. That is, grounding may be achieved by simply connecting to the blocking structures 160 without considering excessive etching of the blocking structures 160. Subsequently, various components and elements of the memory device may be further formed, which will not be further described in detail herein.

Figure 13:
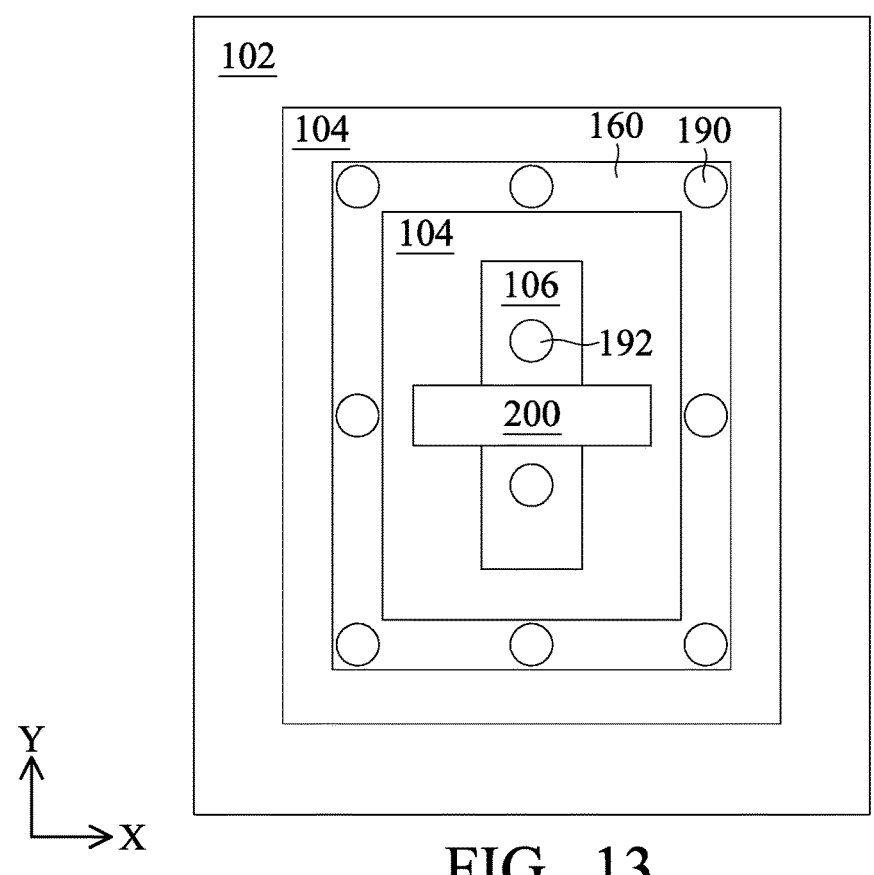

FIG. 12 and FIG. 13 illustrate layouts of the semiconductor structure 10. In some embodiments, the blocking structures 160 are formed between the array region 102 and the peripheral region 106. In some embodiments, the pair of blocking structures 160 is formed around the array region 102 to block the dopant diffusion of the arrays 150 into the peripheral region 106. In some embodiments, the peripheral region 106 surrounds the array region 102. In some embodiments, the space between the array region 102 and the peripheral region 106 is a constant value to control the aspect ratio of the relevant structures and form the blocking structures 160. For example, in FIG. 12, the space S1 is equal to the space S2 and the space S2 is equal to the space S3. In FIG. 12, the width of the blocking structures 160 may be equal to the bottom width W2 of the blocking structures 160 in FIG. 10. It should be noted that the blocking structures 160 are formed in pairs, but for the sake of simplicity, the pair of blocking structures 160 is not shown in FIG. 12 and is represented as one single blocking structure 160. In some embodiments, as shown in FIG. 13, the blocking structure 160 is formed around the peripheral region 106 to block the dopant of the arrays 150 from diffusing to the peripheral region 106. In FIG. 13, a plurality of ground contacts 190 are formed on the transition region 104 to reduce the etching loading on the source/drain contacts 192 formed on the peripheral region 106. In some embodiments, the conductor structure 200 subsequently formed on the peripheral structure 170 does not cross the transition region 104, that is, the conductor structure 200 does not block the formation of the ground contacts 190.

Figure 14:
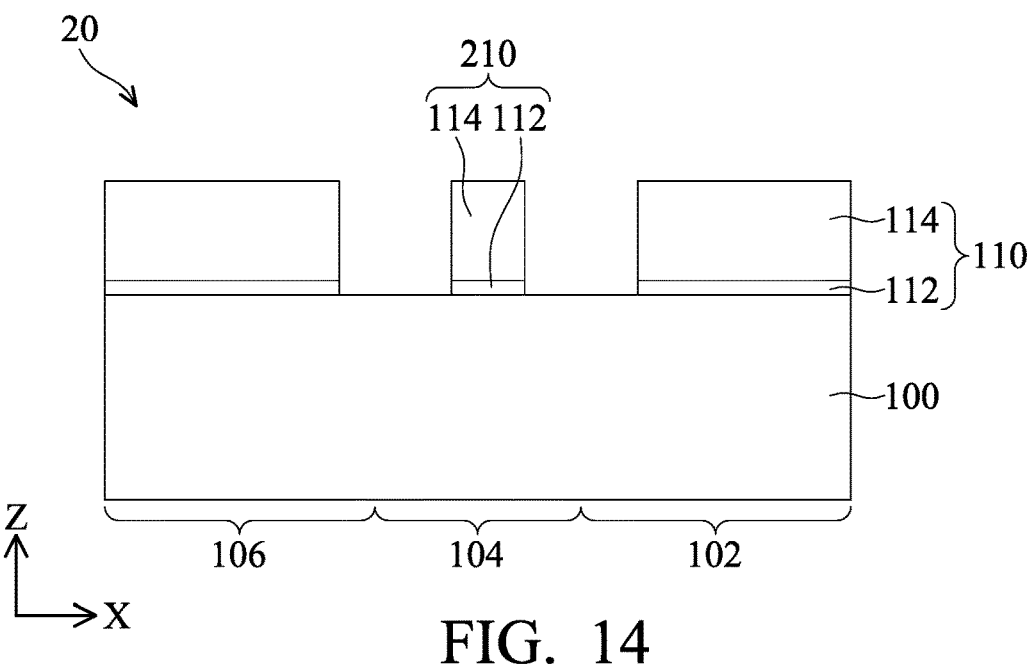
FIGS. 14 to 16 illustrate cross-sectional views of intermediate stages of forming the semiconductor structure according to other embodiments of the present disclosure.
Figure 15:
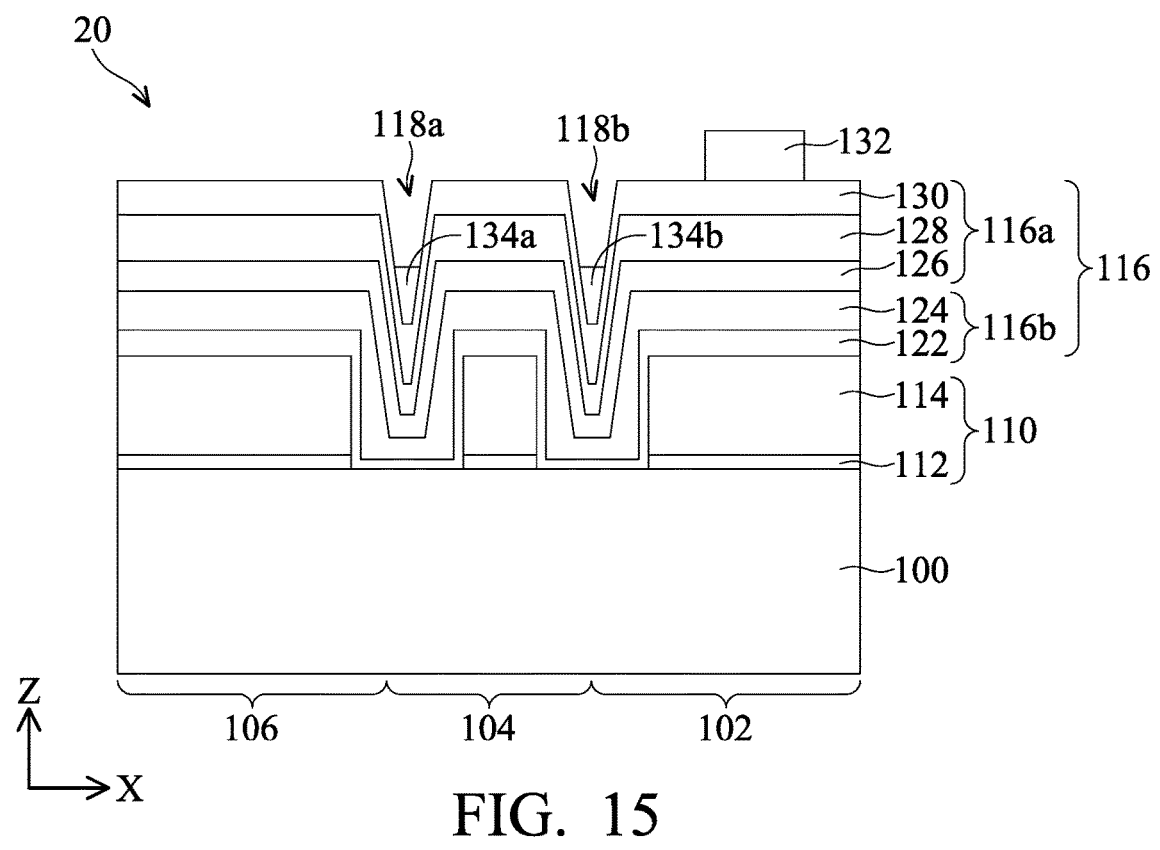
Figure 16:
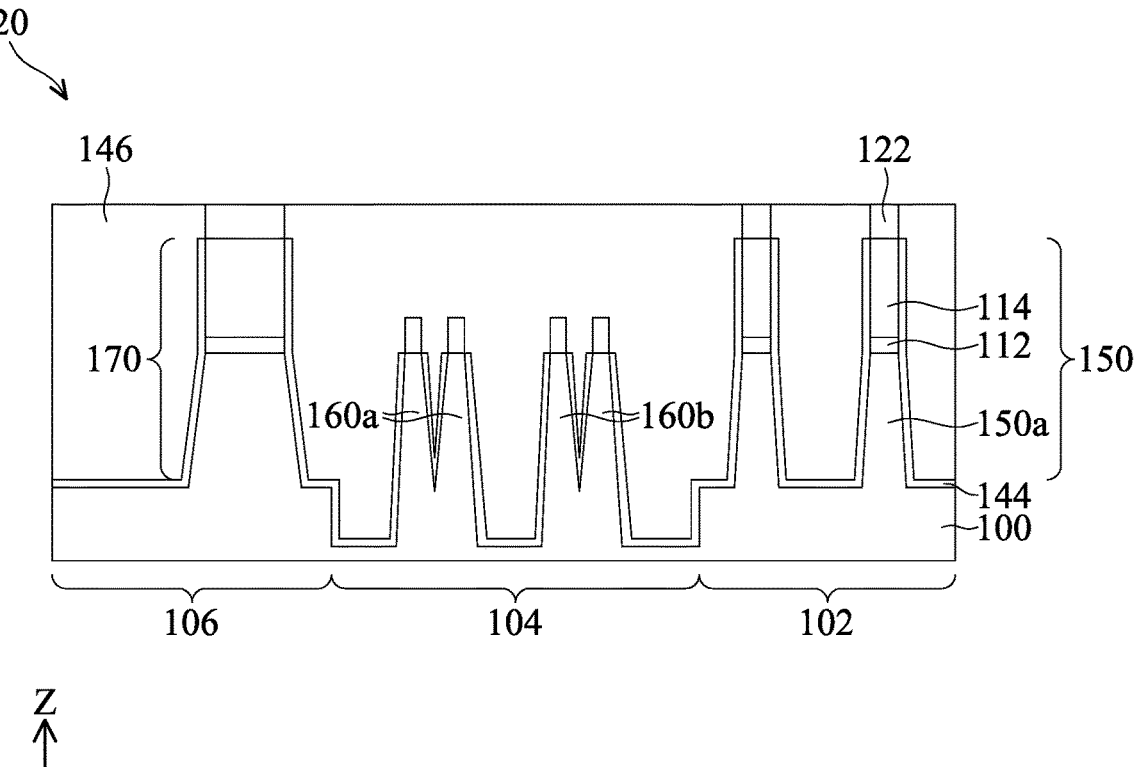

FIGS. 14 to 16 illustrate cross-sectional views of the semiconductor structure 20 forming two pairs of blocking structures 160a and 160b on the transition region 104 according to other embodiments of the present disclosure. In other embodiments, two pairs of blocking structures 160a and 160b may be formed to further reduce the possibility of dopant diffusion from the arrays 150 to the peripheral structure 170. Referring to FIG. 14, a dummy structure 210 may first be formed on the transition region 104 of the substrate 100. More specifically, during the formation of the patterned floating gate layer 110, the dummy structure 210 is additionally formed on the transition region 104 by mask definition, so that the recesses 118a and 118b may be correspondingly formed on the top of the transition region 104 of the substrate 100 during subsequent formation of the stacked layer 116. In some embodiments, the dummy structure 210 also includes a tunneling dielectric layer 112 and a conductive layer 114.

Referring to FIG. 15, the stacked layer 116 is formed on the substrate 100, thereby forming recesses 118a and 118b in the corresponding openings between the dummy structure 210 and the patterned floating gate layer 110. In other words, by forming the dummy structure 210, the aspect ratio of the opening between the dummy structure 210 and the patterned floating gate layer 110 is increased, so that the stacked layer 116 may not completely fill the opening between the dummy structure 210 and the patterned floating gate layer 110. Subsequently, similar to the discussion in FIGS. 2 and FIG. 3 above, the photoresist layer is formed and patterned to form the array region pattern 132 and the recess patterns 134a and 134b on the stacked layer 116. More specifically, a portion of the photoresist layer 120 remains at the bottom of the recesses 118a and 118b and forms the recess patterns 134a and 134b, due to the difference in the optical effect on the bottom of the recesses 118a and 118b.

Referring to FIG. 16, and in conjunction with the descriptions in FIGS. 4 to 9 above, in a manner similar to sequential transferring the array region pattern 132 and the recess pattern 134 to the stacked layer 116, the patterned floating gate layer 110, and the substrate 100, such as by multiple patterning and etching process or other processes, to sequentially transfer the array region pattern 132 and the recess pattern 134a and 134b to the stacked layer 116, the patterned floating gate layer 110, and the substrate 100. In some embodiments, the recess patterns 134a and 134b may correspondingly form two pairs of adjacent blocking structures 160a and 160b in the transition region 104. Next, similar to FIG. 11, two ground contacts 190 may be formed to connect to the blocking structures 160a and 160b, respectively, and will not be further described in detail herein. In other embodiments, referring to FIG. 7 above, after forming the pair of sidewall spacers 138 over the transition region 104, a self-aligned patterning process may be performed (i.e., a self-aligned quadruple patterning process may be performed) to form two pairs of sub-sidewall spacers (not shown) over the transition region 104, thereby correspondingly forming two pairs of blocking structures (not shown) in the subsequent process.

In summary, the embodiment of the present disclosure allows the photoresist layer to remain in the recess formed by the stacked layer due to the change in the opening aspect ratio of the patterned floating gate layer, thereby forming additional sidewall spacers in the transition region and correspondingly forming a blocking structure in the transition region during the subsequent process. The embodiment of the present disclosure prevents the dopant in the arrays from diffusing along the interface between the dielectric layer and the substrate during the subsequent annealing process and causing short circuits in the peripheral region, and maintains the yield of the memory device. Thus, the various embodiments described herein offer several advantages over the existing art. It will be understood that not all advantages have been necessarily discussed herein, no particular advantage is required for all embodiments, and other embodiments may offer different advantages.

The scope of the present disclosure is not limited to the technical solutions consisting of specific combinations of the technical features described above, but should also cover other technical solutions consisting of any combinations of the technical features described above or their equivalent features, all of which are within the scope of the protection of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a plurality of arrays disposed in an array region of a substrate;
a peripheral structure disposed in a peripheral region of the substrate; and
a pair of blocking structures disposed in a transition region of the substrate and comprising a portion of the substrate, wherein the transition region is disposed between the array region and the peripheral region,
wherein the arrays comprise:
a bottom formed by the substrate;
a tunneling dielectric layer formed on the bottom; and
a conductive layer formed on the tunneling dielectric layer, wherein a top surface of the pair of blocking structures is level with a top surface of the bottom.

2. The semiconductor structure as claimed in claim 1, wherein a trench depth between the blocking structures is greater than a trench depth between the arrays.

3. The semiconductor structure as claimed in claim 2, wherein the trench depth between the blocking structures is from about 200 nm to about 300 nm.

4. The semiconductor structure as claimed in claim 2, wherein the trench depth between the arrays is from about 100 nm to about 200 nm.

5. The semiconductor structure as claimed in claim 1, wherein a bottom width of the pair of blocking structures is from about 450 nm to about 550 nm.

6. The semiconductor structure as claimed in claim 1, further comprising:
a dielectric layer disposed on the substrate and covering the arrays, the peripheral structure, and the pair of blocking structures;
a ground contact penetrating the dielectric layer and contacting a top surface of the pair of blocking structures; and
a pair of source/drain contacts in contact with a top surface of the peripheral structure.

7. The semiconductor structure as claimed in claim 1, wherein a top surface of the pair of blocking structures is lower than a top surface of the arrays.

8. The semiconductor structure as claimed in claim 1, further comprising:
another pair of blocking structures disposed in the transition region of the substrate and adjacent to the pair of blocking structures.

9. The semiconductor structure as claimed in claim 1, wherein the peripheral region surrounds the array region, and a space between the array region and the peripheral region is a constant value.

10. A method of forming the semiconductor structure as claimed in claim 1, comprising:
providing a substrate with an array region, a peripheral region, and a transition region between the array region and the peripheral region;
forming a patterned floating gate layer on the array region and the peripheral region;
conformally forming a stacked layer on the substrate, thereby forming a recess over the transition region;
forming a photoresist layer on the substrate and filling the recess with the photoresist layer;
patterning the photoresist layer to form an array region pattern on the stacked layer of the array region, wherein a portion of the photoresist layer remains at a bottom of the recess, thereby forming a recess pattern; and
sequentially transferring the array region pattern and the recess pattern to the stacked layer, the patterned floating gate layer, and the substrate to form a plurality of arrays in the array region and to form a pair of blocking structures in the transition region.

11. The method as claimed in claim 10, wherein sequentially transferring the array region pattern and the recess pattern to the stacked layer, the patterned floating gate layer, and the substrate further comprises:
using the array region pattern and the recess pattern as a mask and etching a first portion of the stacked layer to form a patterned mandrel layer;
removing the array region pattern and the recess pattern;
forming a plurality of sidewall spacers on sidewalls of the patterned mandrel layer;
removing the patterned mandrel layer; and
using the sidewall spacers as a mask, sequentially etching a second portion of the stacked layer, the patterned floating gate layer, and the substrate, thereby forming the arrays and the pair of blocking structures.

12. The method as claimed in claim 11, wherein after removing the patterned mandrel layer, the method further comprises:
forming a mask layer on the substrate and covering the sidewall spacers;
forming a peripheral region pattern on the mask layer of the peripheral region; and
transferring the peripheral region pattern to the mask layer and exposing the sidewall spacers, wherein while using the sidewall spacers as the mask, sequentially etching the second portion of the stacked layer, the patterned floating gate layer, and the substrate, the peripheral region pattern correspondingly forms a peripheral structure in the peripheral region.

13. The method as claimed in claim 10, wherein after forming the arrays and the pair of blocking structures, the method further comprises:
conformally forming a liner covering sidewalls of the arrays and the pair of blocking structures;
forming a dielectric layer to fill trenches between the arrays and to fill trenches between the blocking structures;
performing an annealing process; and
forming a ground contact penetrating the dielectric layer until contacting a top surface of the pair of blocking structures.

14. The method as claimed in claim 10, wherein conformally forming the stacked layer further comprises:

forming a protective layer on the substrate;

forming a conductor layer on the protective layer;

forming a mandrel layer on the conductor layer;

forming a stop layer on the mandrel layer; and forming an anti-reflection layer on the stop layer, wherein the anti-reflection layer is in direct contact with the recess pattern.

15. The method as claimed in claim 10, wherein the patterned floating gate layer has an opening between the array region and the peripheral region of the substrate, and the aspect ratio of the opening is greater than 0.13.

16. The method as claimed in claim 10, wherein forming the patterned floating gate layer further comprises:

forming a dummy structure in the transition region of the substrate, such that conformally forming the stacked layer further comprises forming another recess over the transition region of the substrate, wherein during the patterning of the photoresist layer, another portion of the photoresist layer remains at a bottom of the other recess, thereby forming another recess pattern, wherein while sequentially transferring the array region pattern and the recess pattern to the stacked layer, the patterned floating gate layer, and the substrate, the other recess pattern correspondingly forms another pair of blocking structures in the transition region.

17. The method as claimed in claim 10, wherein forming the patterned floating gate layer further comprises:

forming a tunneling dielectric layer on the substrate;

forming a conductive layer on the tunneling dielectric layer; and performing a patterning process to form the patterned floating gate layer.

18. The method as claimed in claim 17, wherein forming the conductive layer is an in-situ doping process.

19. The method as claimed in claim 10, wherein an opening width of the recess is from about 30 nm to about 40 nm.

* * * * *